United States Patent [19]

Bindell et al.

[11] 4,111,783
[45] Sep. 5, 1978

[54] TRIODE SPUTTERING SYSTEM

[75] Inventors: Jeffrey Bruce Bindell, Allentown; Lowell Henry Holschwandner, Fountain Hill; Edward Franklin Labuda, Allentown; William Dennis Ryden, Whitehall, all of Pa.

[73] Assignee: Bell Telephone Laboratories, Incorporated, Murray Hill, N.J.

[21] Appl. No.: 849,600

[22] Filed: Nov. 8, 1977

[51] Int. Cl.$^2$ ............................................. C23C 15/00
[52] U.S. Cl. .................................................. 204/298
[58] Field of Search ................ 204/192 R, 192 C, 298

[56] References Cited

U.S. PATENT DOCUMENTS

| 3,487,000 | 12/1969 | Hajzak | 204/298 |
|---|---|---|---|
| 3,544,445 | 12/1970 | Moseson et al. | 204/298 |
| 3,562,142 | 2/1971 | Lamont | 204/298 |
| 3,839,182 | 10/1974 | Sager | 204/298 |
| 4,013,533 | 3/1977 | Cohen-Solal et al. | 204/192 S |

OTHER PUBLICATIONS

T. C. Tisone et al., "Low-Voltage Triode Sputtering With A Confined Plasma—Part II—Plasma Characteristics & Energy Transport," *J. Vac. Sci. Tech.* vol. 12, pp. 1058-1066 (1975).

*Primary Examiner*—John H. Mack
*Assistant Examiner*—Aaron Weisstuch
*Attorney, Agent, or Firm*—H. W. Lockhart

[57] ABSTRACT

A triode sputtering system comprises a plasma confining enclosure including a cathode at one end, an anode at the other, and a central plasma supporting portion. Contamination caused by unwanted sputtering of the surfaces of the confining apparatus is substantially eliminated by making the confining enclosure in several, typically four, electrically isolated portions, namely, the cathode support portion, the anode support portion and a pair of plasma support portions. In the structure described there is avoided the relatively large potential difference between the confinement enclosure and the plasma, which occurs predominantly at the anode support end of the confining enclosure of prior art one-piece apparatus. This portion of the apparatus has been found to be the major source of unwanted sputtering therein.

3 Claims, 3 Drawing Figures

TRIODE SPUTTERING SYSTEM

BACKGROUND OF THE INVENTION

This invention relates to cathodic sputtering and, more particularly, to triode apparatus for cathodic sputtering of semiconductor devices.

Cathodic sputtering is an advantageous method for the fabrication of many types of semiconductor devices including particularly monolithic integrated circuits. It is used in both the deposition mode and in the etching mode particularly for making metallic interconnection patterns. However, in both modes a problem arises in that contamination of the semiconductor device surfaces and surface films thereon is likely to occur because the sputtering ions impinge upon surfaces other than the designated target material. This problem is more serious in triode sputtering systems than in those of the simpler diode type because of the additional fixturing of plasma confinement and target and workpiece supports. However, triode systems are of particular interest because they can be used on surface sensitive devices, such as insulated gate field effect devices which are subject to unannealable radiation damage in a diode system environment. In the triode system having a supported discharge, voltage and current can be independent, and operation in a high current-low voltage mode is possible, thus avoiding the higher voltages which cause X-ray radiation damage.

Accordingly, there is need for a triode sputtering system in which contamination from the undesired sputtering of interior surfaces is suppressed.

It should be noted also that triode systems are advantageous in that because a hot cathode supported discharge is used, lower gas pressures and, consequently, higher pumping speeds can be used during sputtering.

SUMMARY OF THE INVENTION

The solution to the foregoing described contamination problem in accordance with this invention, is to form the plasma confining enclosure of a triode sputtering system of a plurality of electrically isolated segments. In one embodiment, the anode and cathode supporting portions each are isolated segments, and the plasma supporting portion, with which the target elements are associated, is formed of two electrically isolated segments. The effect of this configuration is to segment likewise the potential difference occurring between the confining enclosure and the plasma discharge along the length of the confining enclosure. More particularly, by breaking up the potential difference into segments the relatively large voltage difference ordinarily occurring at the anode end of the enclosure is greatly reduced thereby reducing the energy of the ions striking the enclosure near the anode which otherwise contribute very considerably to undesired sputtering.

In a specific embodiment the conventional triode sputtering apparatus is modified by the provision of suitable isolating insulator portions to separate the confining tube or enclosure into four electrically separate but mechanically continuous portions. It will be understood that unwanted sputtering may be reduced even by splitting the apparatus into two portions or three portions, and further, that separation into more than four portions will result in even greater improvement, with, however, added mechanical complexity. Suitable shielding is provided to inhibit deposition on insulator portions which otherwise would tend to reduce the electrical isolation.

THE DRAWING

The invention and its objects and features will be understood more clearly from the following detailed description taken in conjunction with the drawing in which.

DETAILED DESCRIPTION

Figure 1:
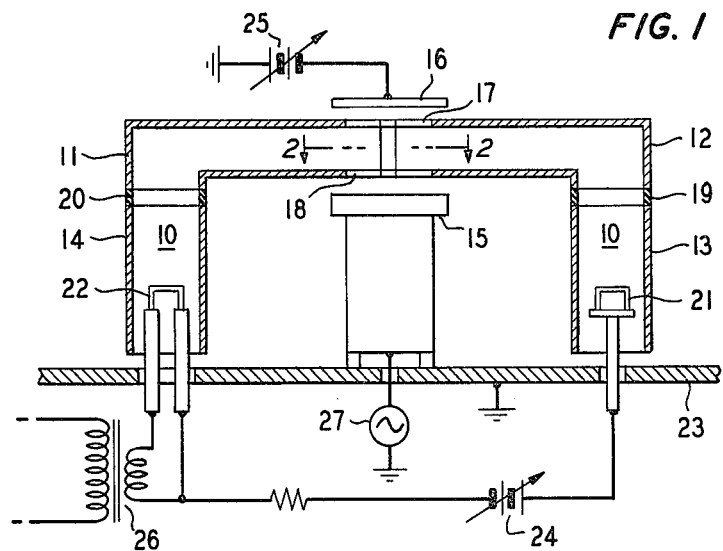
FIG. 1 is a schematic cross section of a triode sputtering aparatus in accordance with the invention.

The invention, in one form, is schematically illustrated in FIG. 1 and includes the essential elements of a conventional triode sputtering system. The plasma confining structure 10 is a tube-like structure typically of square or rectangular cross section which defines an interior that confines a plasma. In one embodiment the tube may be 30.5 by 3.2 cm. in cross section. The plasma confining structure 10 is mounted within a vacuum chamber, not shown, to enable provision of the necessary low pressure ambient.

The plasma confining structure 10 includes windows 17 and 18 for passage of sputtered material between target and substrate which are mounted on plate 16 and pedestal 15, which are coupled to independent power sources 25 and 27, respectively. Plasma is generated by suitably energizing the anode structure 21 and cathode structure 22. The cathode structure 22 is coupled to a.c. power source 26. A variable source of d.c. power 24 provides the necessary voltage differential between cathode and anode. Base plate 23 schematically indicates the mounting base of the apparatus which is at electrical ground.

In this specific embodiment the d.c. source 24 was operated at 10 amperes at 85 volts and the output from a.c. source 26 to the cathode heater was 50 amperes at about 10 volts. The pedestal 15 upon which the workpiece being sputtered is mounted is coupled to a.c. source 27 which in this embodiment, provides 500 volts, peak to peak. The other electrode 16 of the target system is coupled to variable d.c. source 25 operating in this embodiment at 500 volts negative.

Figure 2:
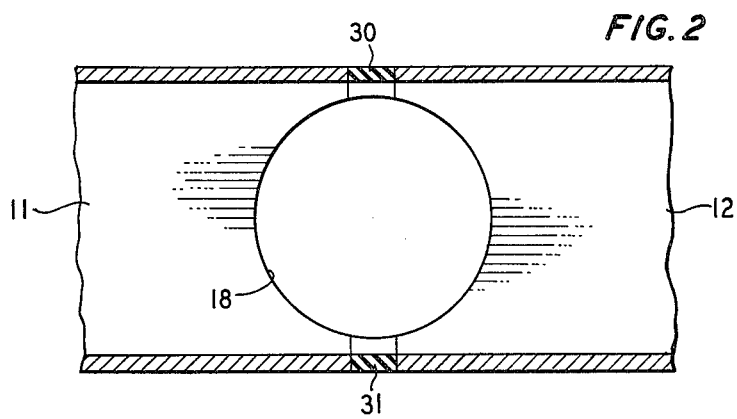
FIG. 2 is a section of a partial plan view of the plasma confinement tube including the lower sputtering window.

The apparatus in accordance with this invention differs from that previously used by making the plasma confining structure of a plurality of electrically isolated portions. In the embodiment of FIG. 1 the structure 10 is formed of four electrically isolated segments. There is an anode portion 13 separated from the remainder of the structure by an insulating segment 19 and a cathode portion 14 isolated by the segment 20. The horizontal leg of the structure 10 including the sputtering windows 17 and 18 is divided into two portions 11 and 12 by an insulating member aligned with the center of the windows. This particular arrangement is illustrated in FIG. 2 in which the lower inside surface of the confinement structure 10 is viewed as from within the tube. The lower sputtering window 18 is, in effect, split in half and the joint on each side is made up of insulating segments 30 and 31 dividing the structure electrically into the two portions 11 and 12. Although not shown, baffle arrangements should be provided to inhibit metal deposition on the insulator portions.

As is known in a sputtering apparatus of this type, a gas, typically argon, is supplied to enable the formation of a gas discharge within the confinement tube between the anode and cathode. Sputtering, either in the etching or deposition mode, results from the impingement of energetic argon ions extracted from the discharge. The energy of the ions is determined by the potential difference between the extracting electrode and the confined discharge. The confinement tube approximates an equipotential surface and, since it is electrically isolated, that is floating, the total net current flowing to the tube is zero. When an isolated surface is in contact with a neutral plasma the surface charges negatively, resulting in the formation of a positive ion space charge sheath between the discharge and the surface. The potential drop across this sheath is such that the total positive ion current flowing to the surface is exactly balanced by the electron current. The electron current is supplied by the high energy portion of the electron energy distribution, since the sheath portion is a retarding potential for electrons. Normally the confinement potential is clamped near cathode potential, apparently as a result of electron interception from the hot cathode filament.

Figure 3:
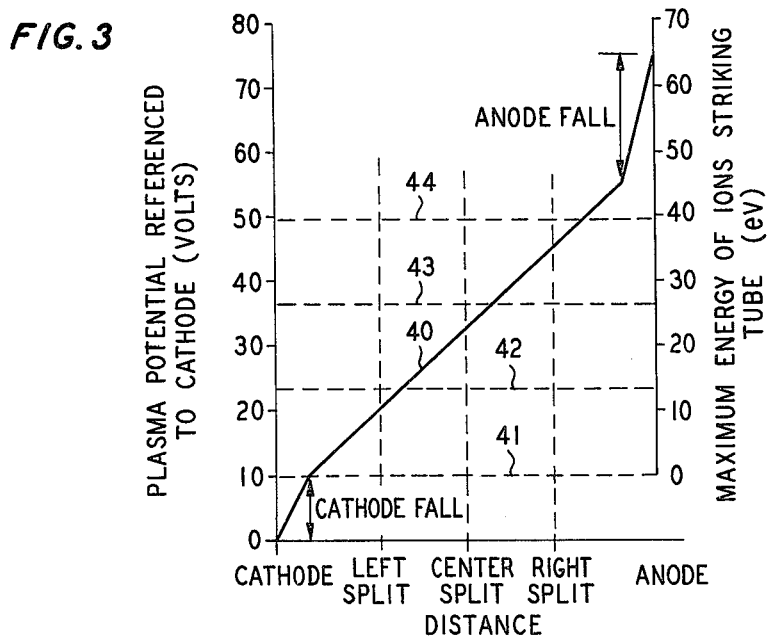
FIG. 3 is a graph depicting the plasma potential from anode to cathode of the apparatus of FIG. 1.

With respect to the potential of the plasma discharge relative to the confinement tube, three distinct regions in the discharge are distinguishable; the anode and cathode falls, and the positive column. The axial electric field in the two fall regions is higher than in the positive column, and the cathode fall is smaller than the anode fall. The graph 40 of FIG. 3 depicts the plasma potential from anode to cathode as indicated by the scale on the left side. The plasma confining structure potential is close to cathode potential and, in this embodiment, has the value as indicated by the broken line 41. The maximum energy of the ions striking the box along the length of the plasma discharge is given by the vertical scale on the right side of FIG. 3 for a non-segmented plasma confinement tube. The quantitative plasma potential and ion energy numbers given in the graph of FIG. 3 are for the conditions set forth above.

Applicants have determined that the contamination from sputtering of materials from the confinement tube comes predominantly from the anode end of the tube, indicating that the maximum energy of the ions striking the interior of the confinement tube ranges from less than the threshold energy, typically 20 eV, for sputtering near the cathode, to well above the sputtering threshold near the anode. In addition, ions created near the anode accelerated across the entire anode fall can cause substantial sputtering.

In accordance with this invention and as depicted in the embodiment of FIGS. 1 and 2, the plasma confinement structure 10 is arranged so that it consists of four electrically isolated segments, in order to reduce the contamination resulting from sputtering of the confinement tube. As a consequence of this division, the entire plasma confinement structure no longer is an equipotential surface and each of the segments attains a potential closer to the local plasma potential. The equilibrium potential of each of the isolated segments of the confinement structure is determined by the requirement that the total current flowing to a given segment from the discharge is zero, and thus that the electron current to the segment is equal to the positive ion current. However, since the electron mobility in the dischrge is much greater than the ion mobility, these currents are not distributed uniformly along the portion. The collected current along the portion will vary from being a net electron current to a net ion current going from cathode to anode. The crossover point from electron to ion current is very near the cathode end of the portion because of the much higher electron mobility. Thus, the potential of a particular isolated portion is clamped to a value slightly smaller than the plasma potential at the cathode end of the portion. Accordingly, there will be a limited rise in the maximum energy of ions going from the cathode to the anode end of each portion and the ion energy levels will remain substantially below those which are attained in continuous confinement tube structures.

This can be seen in FIG. 3 in which the broken lines 41, 42, 43 and 44 represent the value of the potential respectively, of confinement tube portions 14, 11, 12 and 13. Thus, in the cathode portion 14 the potential below broken line 41, referred to as cathode fall, is the negative electron voltage. The ion potential at any location within the portion 14 is determined by the vertical distance from broken line 41 to graph 40 at the particular location. Correspondingly, in the plasma support portion 11, the ion potential at any point is indicated by the vertical distance from the broken line 42 to the graph 40. Again there is a small negative portion below the crossover point of graph 40 and broken line 42 to the level where graph 40 intersects the vertical broken line denoted left split which represents the insulator segment 20. This negative portion represents electron current. The ion potential is similarly determined in portions 12 and 13 by measuring upward from the broken lines 43 and 44 respectively, to graph 40.

From the foregoing, it will be appreciated that additional improvement can be achieved in reducing unwanted sputtering by increasing the segmentation of the confinement apparatus. The greater the number of insulated portions, the lower will be the maximum ion potential in any given portion. However, the mechanical complexity and the difficulty of fabrication will obviously be increased. In the embodiment disclosed herein using four isolated portions, sufficient improvement using the parameters disclosed has been achieved to eliminate a considerable amount of the unwanted contamination.

What is claimed is:

1. A triode sputtering apparatus for reducing contamination from unwanted sputtering of the apparatus comprising a confining tube including an anode support portion, a cathode support portion and a plasma support portion, characterized in that said confining tube comprises at least two electrically isolated portions.

2. The apparatus in accordance with claim 1 in which said confining tube consists of four electrically isolated portions.

3. The apparatus in accordance with claim 2 in which said four portions consist of an anode support portion, a cathode support portion, a first plasma support portion and a second plasma support portion.

* * * * *